United States Patent
Chen et al.

(10) Patent No.: US 7,382,831 B1
(45) Date of Patent: Jun. 3, 2008

(54) VITERBI DECODER UTILIZING COMPRESSED SURVIVAL METRICS FOR REDUCED MEMORY SIZE REQUIREMENTS

(75) Inventors: Chihming (Norman) Chen, Cupertino, CA (US); Howard Hicks, La Jolla, CA (US); Chien-Meen Hwang, San Jose, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 882 days.

(21) Appl. No.: 10/839,351

(22) Filed: May 6, 2004

Related U.S. Application Data

(63) Continuation-in-part of application No. 10/458,285, filed on Jun. 11, 2003, now Pat. No. 7,248,637.

(51) Int. Cl.
*H04L 5/12* (2006.01)
*H04L 23/02* (2006.01)

(52) U.S. Cl. .................. 375/262; 375/341; 714/795; 714/796

(58) Field of Classification Search .............. 375/262, 375/265, 341; 714/794, 795, 796
See application file for complete search history.

(56) References Cited

U.S. PATENT DOCUMENTS

| | | | | |
|---|---|---|---|---|
| 4,905,317 | A * | 2/1990 | Suzuki et al. ................. | 341/51 |
| 5,509,021 | A * | 4/1996 | Todoroki ..................... | 714/795 |
| 5,923,713 | A * | 7/1999 | Hatakeyama ................ | 375/341 |
| 6,148,431 | A * | 11/2000 | Lee et al. .................... | 714/794 |
| 6,654,929 | B1 * | 11/2003 | Kamada ....................... | 714/795 |
| 6,697,442 | B1 * | 2/2004 | Todoroki ..................... | 375/341 |

OTHER PUBLICATIONS

Fleming, "Introduction", *A Tutorial on Convolutional Coding with Viterbi Decoding*, http://pw1.nectom.com/~chip.f/viterbi/tutorial.html, Mar. 15, 2001, pp. 1-4, Spectrum Applications.

Fleming, "Description of the Data Generation . . . ", *A Tutorial on Convolutional Coding with Viterbi Decoding*, http://pw1.nectom.com/~chip.f/viterbi/algrthms.html, Mar. 15, 2001, pp. 1-7, Sepctrum Applications.

Fleming, "Description of the Viterbi Decoding . . . ", *A Tutorial on Convolutional Coding with Viterbi Decoding*, http://pw1.nectom.com/~chip.f/viterbi/algrthms2.html, Mar. 15, 2001, pp. 1-9, Spectrum Applications.

Supplement to IEEE Standard for Information technology—Telecommunications and information exchange between systems—Local and metropolitan area networks—Specific requirements, "Part 11: Wireless LAN Medium Access Control (MAC) and Physical Layer (PHY) specifications: High-speed Physical Layer in the 5 GHZ Band", Sep. 16, 1999, pp. 1-82, Institute of Electrical and Electronics Engineers, Inc., New York, NY.

Van Nee et al., *OFDM Wireless Multimedia Communications*, 2000, pp. 61-65.

* cited by examiner

*Primary Examiner*—Phuong Phu
(74) *Attorney, Agent, or Firm*—Manelli Denison & Selter PLLC; Leon R. Turkevich

(57) ABSTRACT

A Viterbi decoder is configured for subtracting each survivor metric for each corresponding encoder state by a prescribed subtraction operator based on a prescribed event. The subtraction of each survivor metric by a prescribed subtraction operator based on a prescribed event minimizes memory requirements in the accumulated metric table by limiting the survivor metric values to a identifiable range. Hence, the Viterbi decoder can be implemented in an economical manner with reduced memory requirements.

9 Claims, 10 Drawing Sheets

VITERBI DECODER UTILIZING COMPRESSED SURVIVAL METRICS FOR REDUCED MEMORY SIZE REQUIREMENTS

CROSS REFERENCE TO RELATED APPLICATIONS

This application is a continuation-in-part of application Ser. No. 10/458,285, filed Jun. 11, 2003 now U.S. Pat. No. 7,248,637.

BACKGROUND OF THE INVENTION

1. Field of the Invention

The present invention relates to implementation of a Viterbi decoder in a wireless receiver, for example a IEEE 802.11a based Orthogonal Frequency Division Multiplexing (OFDM) receiver.

2. Background Art

Local area networks historically have used a network cable or other media to link stations on a network. Newer wireless technologies are being developed to utilize OFDM modulation techniques for wireless local area networking applications, including wireless LANs (i.e., wireless infrastructures having fixed access points), mobile ad hoc networks, etc. In particular, the IEEE Standard 802.11a, entitled "Wireless LAN Medium Access Control (MAC) and Physical Layer (PHY) specifications: High-speed Physical Layer in the 5 GHz Band", specifies an OFDM PHY for a wireless LAN with data payload communication capabilities of up to 54 Mbps. The IEEE 802.11a Standard specifies a PHY system that uses fifty-two (52) subcarrier frequencies that are modulated using binary or quadrature phase shift keying (BPSK/QPSK), 16-quadrature amplitude modulation (QAM), or 64-QAM.

Hence, the IEEE Standard 802.11a specifies an OFDM PHY that provides high speed wireless data transmission with multiple techniques for minimizing data errors.

A particular concern in implementing an IEEE 802.11 based OFDM PHY in hardware involves providing a cost-effective, compact device the can be implemented in smaller wireless devices. Hence, implementation concerns typically involve cost, device size, and device complexity.

For example, a forward error correction technique, known as convolutional coding with Viterbi decoding, has been used to provide encoded data to reduce bit errors. The purpose of forward error correction (FEC) is to improve the capacity of a wireless channel by adding some carefully designed redundant information to the data being transmitted through the channel. The process of adding this redundant information is known as channel coding. Convolutional coding and block coding are the two major forms of channel coding. Convolutional codes operate on serial data, one or a few bits at a time. Block codes operate on relatively large (typically, up to a couple of hundred bytes) message blocks. There are a variety of useful convolutional and block codes, and a variety of algorithms for decoding the received coded information sequences to recover the original data.

Convolutional codes are usually described using two parameters: the code rate and the constraint length. The code rate, k/n, is expressed as a ratio of the number of uncoded bits into the convolutional encoder (k) to the number of coded bits output by the convolutional encoder (n) in a given encoder cycle. The constraint length parameter, K, denotes the "length" of the convolutional encoder, i.e. how many k-bit stages are available to feed the combinatorial logic that produces the output symbols. Closely related to K is the parameter m, which indicates how many encoder cycles an input bit is retained and used for encoding after it first appears at the input to the convolutional encoder. The m parameter can be thought of as the memory length of the encoder.

Viterbi decoding has the advantage that it has a fixed decoding time. It is well suited to hardware decoder implementation. But its computational requirements grow exponentially as a function of the constraint length K. In particular, the convolutional encoding of the data is accomplished using a shift register (composed of a prescribed number of flip flops) and associated combinatorial logic that performs modulo-two addition (e.g., XOR addition).

A significant characteristic of the convolutional encoding is that an input bit to the convolutional encoder (having, for example, two flip flops) has an effect on three successive pairs of output symbols. In particular, the state of a two-flip-flop register transitions to a prescribed new state in response to the next input; consequently, the output symbols of the convolutional encoder will follow a prescribed transition to one of two states (from a domain of $2^{(K-1)}$ possible states) based on: (1) the state of the shift register, and (2) the input data. For example, in the case of a ½ convolutional encoder having 6 flip flops with a state of "19" (decimal) (i.e., 110010, left-most bit being the least significant bit and right-most bit being the most significant bit), an input bit having a value of "1" or "0" would cause the shift register to change to a state of "39" or "38", respectively. Both the state transitions of the flip flops and the output symbols, also referred to as auto-correlation of the input data, can be characterized by respective output tables having $2^{(K-1)}$ rows, and $2^k$ columns, where K is the constraint length and k is the number of bits input to the encoder for each cycle.

The maximum size code word for IEEE 802.11a packets is $2^{15}$ bits, and the ½ convolutional encoder (n=2, k=1) has 64 possible states based on a constraint length K=7 (i.e., based on the convolutional encoder having six (m=6) flip flops). In particular, given N bits for an input data stream, there are a possible $2^N$ state transitions that may occur by the encoded data during the encoding of the data stream.

The Viterbi decoder determines the most likely state (i.e., encoded value) based on evaluating the sequence of received encoded code words. In other words, the Viterbi decoder determines, given an initial zero state of the encoder, the most probable value for a given encoder state relative to the respective transitions from other detected states; determining a state transition implicitly identifies the encoded data and vice versa. In summary, the Viterbi decoder, in response to receiving a pair of channel symbols, stores the received channel symbol pair and determines a distance metric (also referred to herein as an error metric) between the received channel symbol pair and the possible channel symbol pairs (which map to the respective possible encoder states). The mapping of an existing encoder state to a new state based on the input bit value is often illustrated using a Trellis diagram. As successive channel symbol pairs are received, the respective error metrics are applied to the prior possible encoder states to determine which of the prior possible encoder states become part of the surviving predecessor state sequences having the lowest respective accumulated errors.

The accumulated error value for each encoder state at each iteration (i.e., each instance of receiving a corresponding channel symbol pair) is stored in an accumulated metric table that specifies the accumulated error metric, for each possible encoder state, at that iteration. Note that the accumulated error metric also is referred to herein as the survival metric. The surviving predecessor state for each encoder state at each iteration (i.e., each instance of receiving a corresponding channel symbol pair) is stored in a surviving state history table that specifies the surviving predecessor state, for each possible encoder state, at each time instance. Once the accumulated metric table and the surviving state history table has been populated with the respective values generated from stream of channel symbol pairs, a traceback algorithm recovers the original encoded stream based on tracing back from the state having minimum accumulated error metric in the accumulated metric table for a given instance (starting with the last time instance representing the last received channel symbol pair), to the prior state specified in the surviving state history table. Additional details of Viterbi decoding are described by Fleming, "A Tutorial on Convolutional Coding with Viterbi Decoding", 2001.

A particular problem of conventional Viterbi decoders involves the large number of computations required over the entire length of the convolutional encoded data stream. Since a code word can have a length of up to 4095 bytes, the storage of all state transitions during decoding of an entire code word could require at least 2-3 Mbytes of memory.

One solution is to utilize a prescribed minimum number of instances (i.e., the traceback depth) to decode the first pair (i.e., two bits) of channel symbols. For example, the above-referenced Fleming document suggests a traceback depth of K×5 for Viterbi decoding a pair of channel symbols. Hence, a traceback decoding window having a depth of K×5 is used to decode a pair of convolutionally-encoded data bits.

However, even the use of a traceback decoding window of depth K×5 to decode a pair of convolutionally-encoded data bits may be insufficient for providing an economical implementation of an ODFM PHY capable of decoding the high data rates specified by IEEE 802.11a (e.g., 54 Mbps). In particular, use of a 25-instance window (50-bit window) (K=5) in a Viterbi decoder using a 40 MHz clock limits the output data rate to 3.2 Mbps (2/(25/40 MHz)=3.2 Mbps), assuming a single read port state history table.

In addition, the storage of the accumulated error metric for each possible encoder state imposes a substantially large memory requirement for the accumulated metric table. In particular, the dynamic range of the accumulated error metric can increase linearly as the traceback depth increases (max error per iteration multiplied by the traceback depth); hence, a substantially large memory/register is needed for each accumulated error metric, else the corresponding accumulated error metric may encounter overflow/underflow errors that result in errors in decoding the data.

SUMMARY OF THE INVENTION

There is a need for an arrangement that enables a wireless transceiver host to perform Viterbi decoding of a received encoded stream in an efficient and economical manner.

There also is a need for an arrangement that enables a wireless transceiver host to perform Viterbi decoding for IEEE 802.11a based communications without substantial memory requirements.

These and other needs are attained by the present invention, where a Viterbi decoder is configured for subtracting each survivor metric for each corresponding encoder state by a prescribed subtraction operator based on a prescribed event. The subtraction of each survivor metric by a prescribed subtraction operator based on a prescribed event minimizes memory requirements in the accumulated metric table by limiting the survivor metric values to a identifiable range. Hence, the Viterbi decoder can be implemented in an economical manner with reduced memory requirements.

One aspect of the present invention provides a method in a Viterbi decoder for decoding received encoded bit pairs. The method includes first storing in a survivor metric register file, for each received bit pair at a corresponding time instance, a survivor metric that specifies a corresponding probability of the received bit pair and a previous surviving bit sequence having been generated by a convolutional encoder according to a corresponding possible encoder state, the first storing step including selectively subtracting from each survivor metric, prior to storage thereof, by a prescribed subtraction operator based on a prescribed event. The method also includes second storing in a state history table memory, for each of the received bit pairs at the corresponding time instance, a prior encoder state entry configured for identifying a surviving predecessor state relative to a corresponding encoder state. The method also includes outputting at least one decoded bit pair based on execution of a backtracing operation that includes accessing a prescribed number of the prior encoder state entries for the respective prescribed number of time instances, the accessing including identifying one of the encoder states, stored at a corresponding first time instance, as an initial backtracing state based on having the corresponding survivor metric specifying a highest probability relative to the other survivor metrics at the corresponding first time instance.

Another aspect of the present invention provides a Viterbi decoder. The decoder includes an add-compare-select logic circuit, a survivor metric register file, a state history table memory, and a state machine. The add-compare-select logic circuit is configured for generating, for each received bit pair at a corresponding time instance, a survivor metric that specifies a corresponding probability of the received bit pair and a previous surviving bit sequence having been generated by a convolutional encoder according to a corresponding possible encoder state, the add-compare-select logic configured for selectively subtracting from each survivor metric, prior to storage thereof, by a prescribed subtraction operator based on a prescribed event. The survivor metric register file is configured for storing the respective survivor metrics for the respective possible encoder states. The state history table memory is configured for storing, for each of the received bit pairs at the corresponding time instance, a prior encoder state entry configured for identifying a surviving predecessor state relative to a corresponding encoder state. The state machine is configured for outputting at least one decoded bit pair based on execution of a first backtracing operation that accesses a prescribed number of the prior encoder state entries for the respective prescribed number of time instances, the first backtracing operation configured for identifying one of the encoder states, stored at a corresponding first time instance, as an initial backtracing state based on having the corresponding survivor metric specifying a highest probability relative to the other survivor metrics at the corresponding first time instance.

Additional advantages and novel features of the invention will be set forth in part in the description which follows and in part will become apparent to those skilled in the art upon examination of the following or may be learned by practice of the invention. The advantages of the present invention may be realized and attained by means of instrumentalities and combinations particularly pointed in the appended claims.

BRIEF DESCRIPTION OF THE DRAWINGS

Reference is made to the attached drawings, wherein elements having the same reference numeral designations represent like elements throughout and wherein.

BEST MODE FOR CARRYING OUT THE INVENTION

Figure 1:
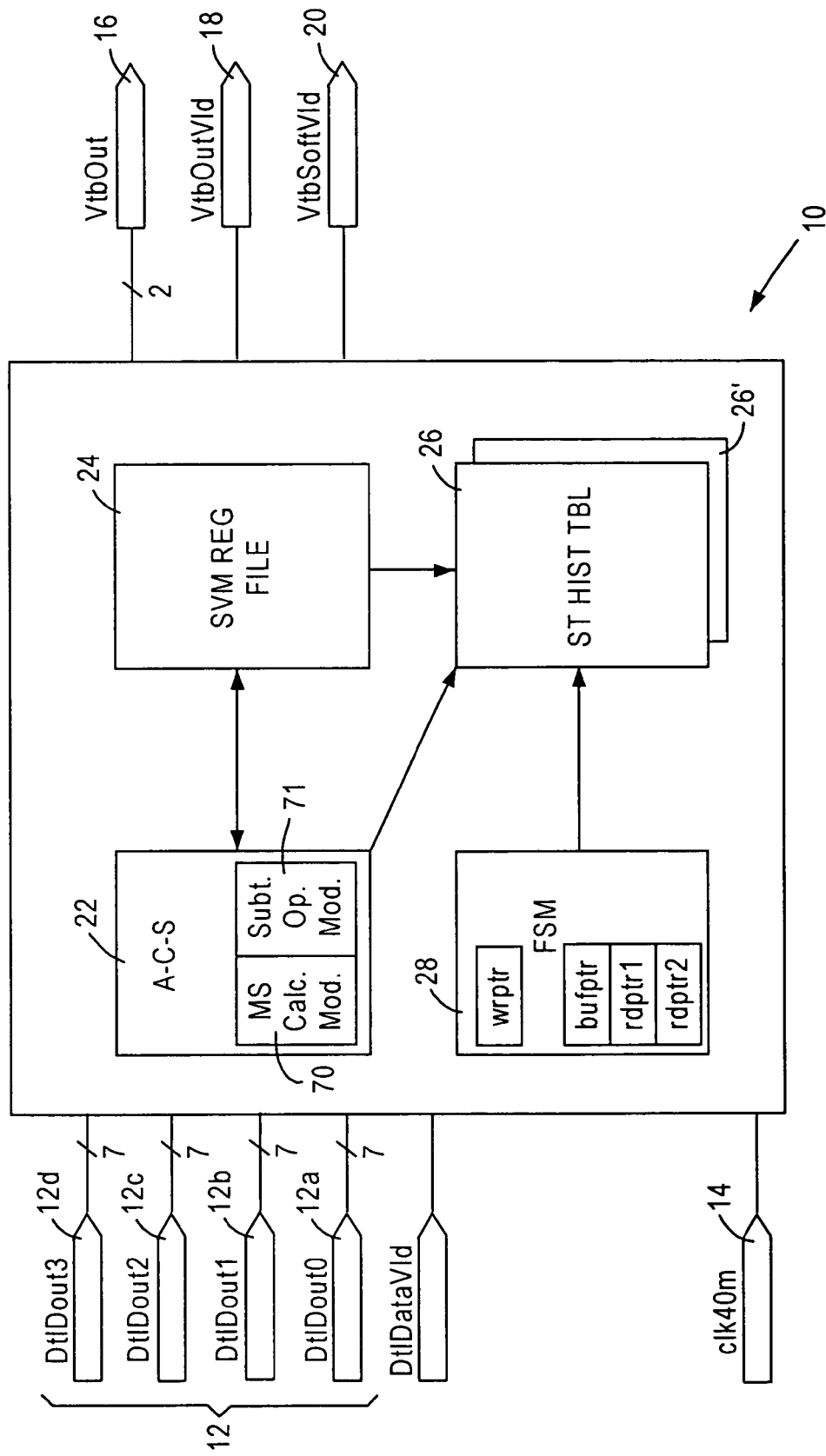
FIG. 1 is a diagram illustrating a Viterbi decoder according to an embodiment of the present invention.

FIG. 1 is a diagram illustrating a Viterbi decoder 10 for use in a receiver module of an IEEE 802.11 Orthogonal Frequency Division Multiplexing (OFDM) transceiver, according to an embodiment of the present invention. The Viterbi decoder 10 is configured for decoding deinterleaved data 12 from a deinterleaver (not shown) into decoded data, in accordance with the IEEE 802.11 specification.

In particular, the Viterbi decoder 10 is configured for receiving encoded bit pairs as 7-bit soft metric values, generated by slicer circuits internal to the OFDM transceiver, where signed integer values are represented in 7-bit notation (1-bit sign and 6-bit value) instead of binary. The 7-bit soft metric values 12a, 12b, 12c, and 12d represent encoded bit pairs at time instances t1 and t2. The Viterbi decoder 10 is given by a 40 MHz clock 14, and outputs decoded bit pairs via an output path 16, with a data valid strobe 18 and a decoding valid strobe 20 used to identify the validity of the decoded bit pairs.

The disclosed Viterbi decoder 10 is configured for decoding a Forward Error Correcting code word convolutionally encoded at rate K=½ with a binary encoder of constraint length k=7. The Viterbi decoder 10 includes an add-compare-select (A-C-S) logic circuit 22, a survivor metric (SVM) register file 24, a state history table memory 26, and a finite state machine 28. As described below with respect to FIG. 7, the Viterbi decoder 10 also may include a second state history table 26' configured for storing encoder state entries, enabling concurrent backtracing operations using overlapping prior encoder state entries.

The add-compare-select logic circuit 22 is configured for generating, for each received bit pair at a corresponding time instance, a survivor metric that specifies a corresponding probability of the received bit pair and a previous surviving bit sequence having been generated by a convolutional encoder according to a corresponding possible encoder state. In particular, unlike conventional Trellis diagram-based Viterbi decoders that rely on Hamming distance measurements to identify relative amounts of error in branch metrics (used as components of accumulated survivor metrics), the add-compare-select logic circuit 22 calculates survivor metrics in terms of "maximizing coded bit likelihood" instead of minimum accumulated error. Further details of the add-compare-select logic circuit 22 a described below with respect to FIGS. 4 and 5. Additional details related to maximum coded bit likelihood can be found on pages 62-65 of "OFDM for Wireless Multimedia Communications" by Richard Van Nee, Ramjee Prasad, copyright 2000 by Artech House, Boston, Mass. (ISBN 0-89886-530-6).

The add-compare-select logic circuit 22 stores the survivor metrics for each of the possible encoder states in a survivor metric register file 24. The survivor metric register file 24 is configured for storing 9-bit accumulated survivor metrics for each of the sixty-four (64) possible encoder states. As described below, the add-compare-select logic circuit 22 includes at least one maximum surviving state metric calculation module (MS Calc. Mod.) 70, and a subtraction operator module 71.

Figure 6A:
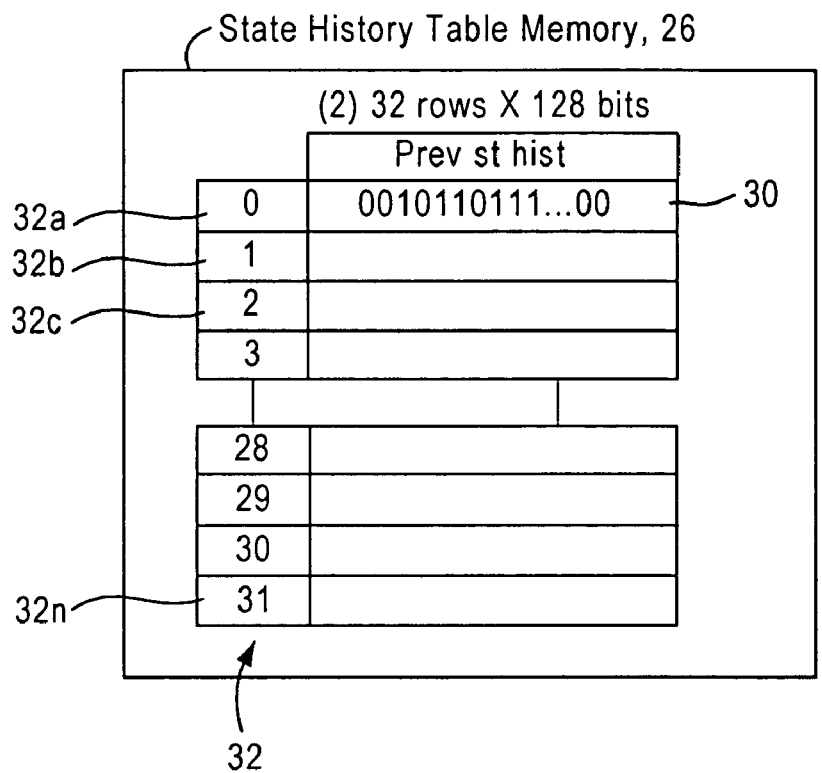
FIGS. 6A and 6B are diagrams illustrating in detail the state history table memory of FIG. 1 and a state history table memory entry, respectively.
Figure 6B:
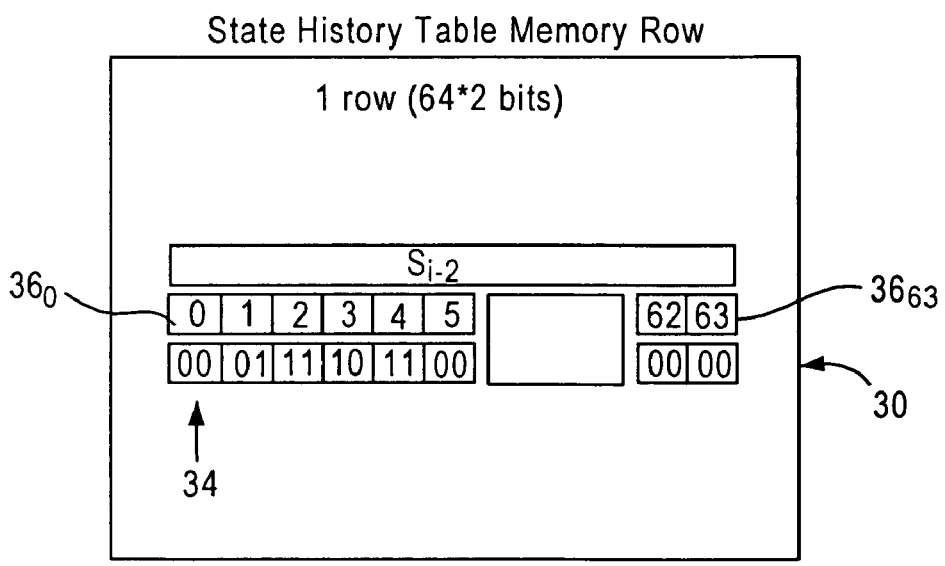

The state history table 26 and 26', illustrated in detail in FIG. 6A, are configured for storing, for each of the received bit pairs at the corresponding time instance, a prior encoder state entry 30 that identifies surviving predecessor states relative to a corresponding encoder state. As illustrated in FIG. 6B, each entry 30 for a given time instance 32 (e.g., 32c) includes bit pairs of 34 for each of the corresponding encoder states 36: the bit pairs 36 stored in the prior encoder state entry 30 represent the actual decoded bit pair that causes the encoder to succeed from the surviving predecessor encoder state at the prior time instance (e.g., 32b) to the corresponding encoder state at the corresponding time instance (e.g., 32c). As recognized in the art, the actual predecessor state can be implicitly determined from the actual decoded bit pair and the known successor state.

Figure 2:
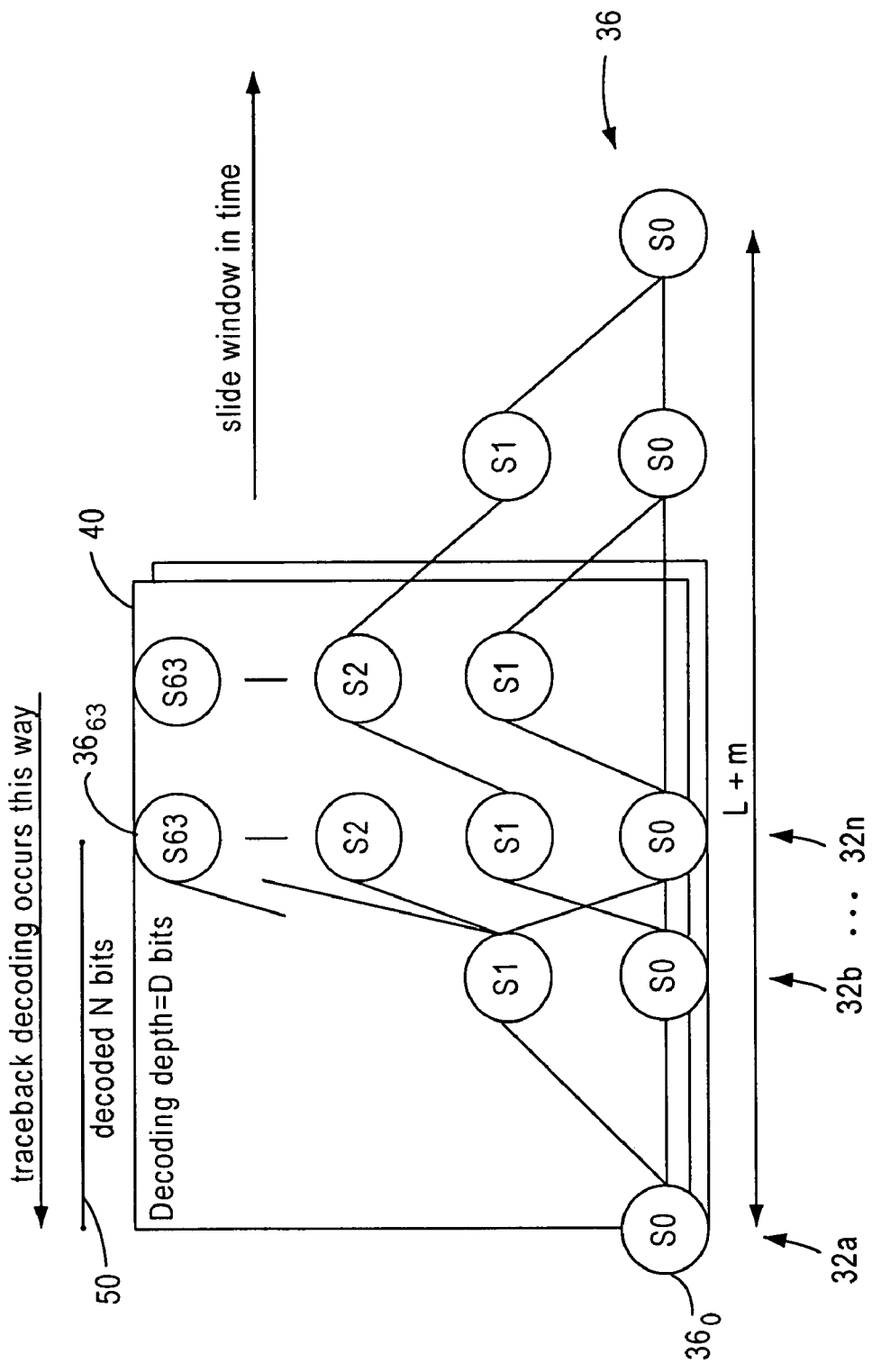
FIG. 2 is a diagram illustrating a traceback operation by the Viterbi decoder of FIG. 1, according to an embodiment of the present invention.

FIG. 2 is a diagram illustrating the traceback operation by the finite state machine 28. The state machine 28 is configured for outputting a prescribed plurality (N) of decoded bit pairs 50 based on execution of each backtracing operation using a decoding window 40 having a depth D. In particular, the maximum size code word in 802.11a packets is $2^{15}$ bits, hence 64 possible encoder states 36 (e.g., $36_0$ to $36_{63}$) exist with k=7; hence, decoding history must be truncated to a size which can be stored in a reasonably-sized memory on an ASIC (<100 Kb). Decoding data in this manner implies a reverse traversal of possible encoding state history based on received data and possible encoder states given known initial and final conditions (basic backtrace algorithm). FIG. 2 illustrates the span of the decoding window over a code word of length L with trellis diagram corresponding to encoder size m=6. The window size D was chosen based on stochastic simulation data of words encoded using the 802.11a method of channel encoding—in this case, the window depth D=50 bits (or 25 bit pairs) provided an acceptable bit error rate.

Figure 3A:
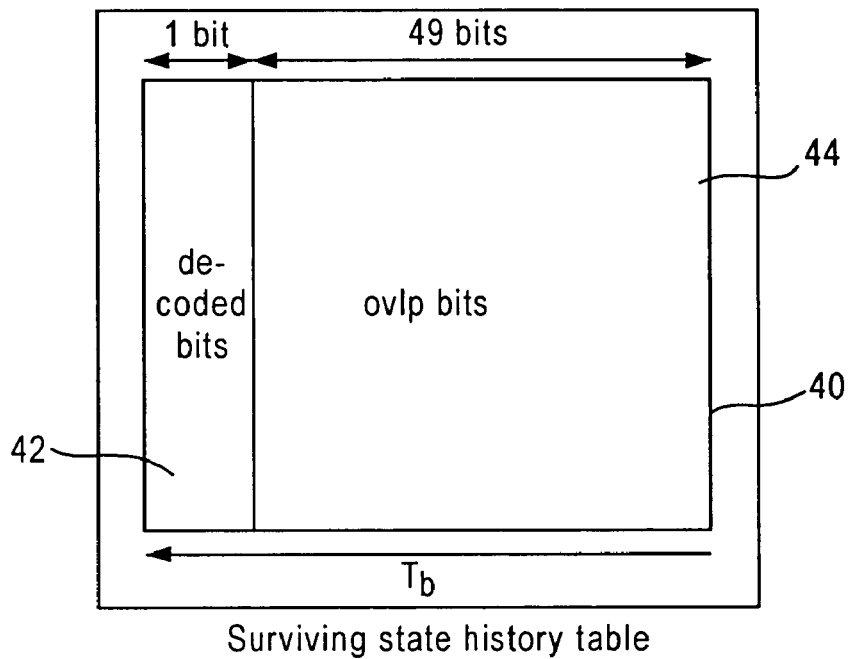
FIG. 3A is a conventional (PRIOR ART) decoding of a surviving state history table.

The traceback operation executed by the finite state machine 28 generates a prescribed plural number of N decoded bit pairs 50, where N can be equal, for example, to N=32 bits (or 16 bit pairs). Note that prior art techniques of performing backtracing, illustrated in FIG. 3A, resulted in a single decoded bit 42 and forty-nine (49) overlap bits 44 that were saved and retrieved for the next backtracing cycle, resulting in reduced throughput and requiring substantially more memory accesses.

Figure 3B:
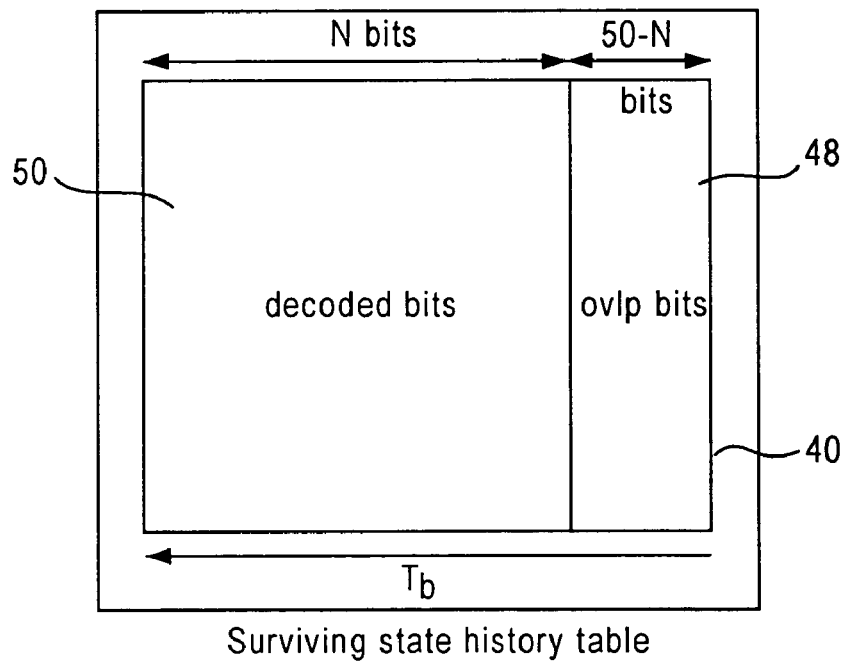
FIG. 3B is a diagram illustrating a decoding of a surviving state history table by the traceback operation of FIG. 2.

According to the disclosed embodiment, each backtracing operation as illustrated in FIGS. 2 and 3B over a prescribed window depth (D) 40 results in a plural number (N) of decoded bits 50, where in this example the number of decoded bits N=36. Hence, the overlap bits 48 that are preserved for the next backtracing sequence are substantially reduced relative to the overlap bits 44 left from the conventional backtracing operation of FIG. 3A. Stochastic simulation with AWGN data was used to determine the minimum overlap (D–N): use of overlapping bits where N=32 resulted in a coding gain degradation of less than or equal to 0.5 dB for data rates ranging from 6 Mbps to 54 Mbps, where 0.5 dB was deemed the threshold of acceptable performance loss, compared to where N=1.

Figure 4:
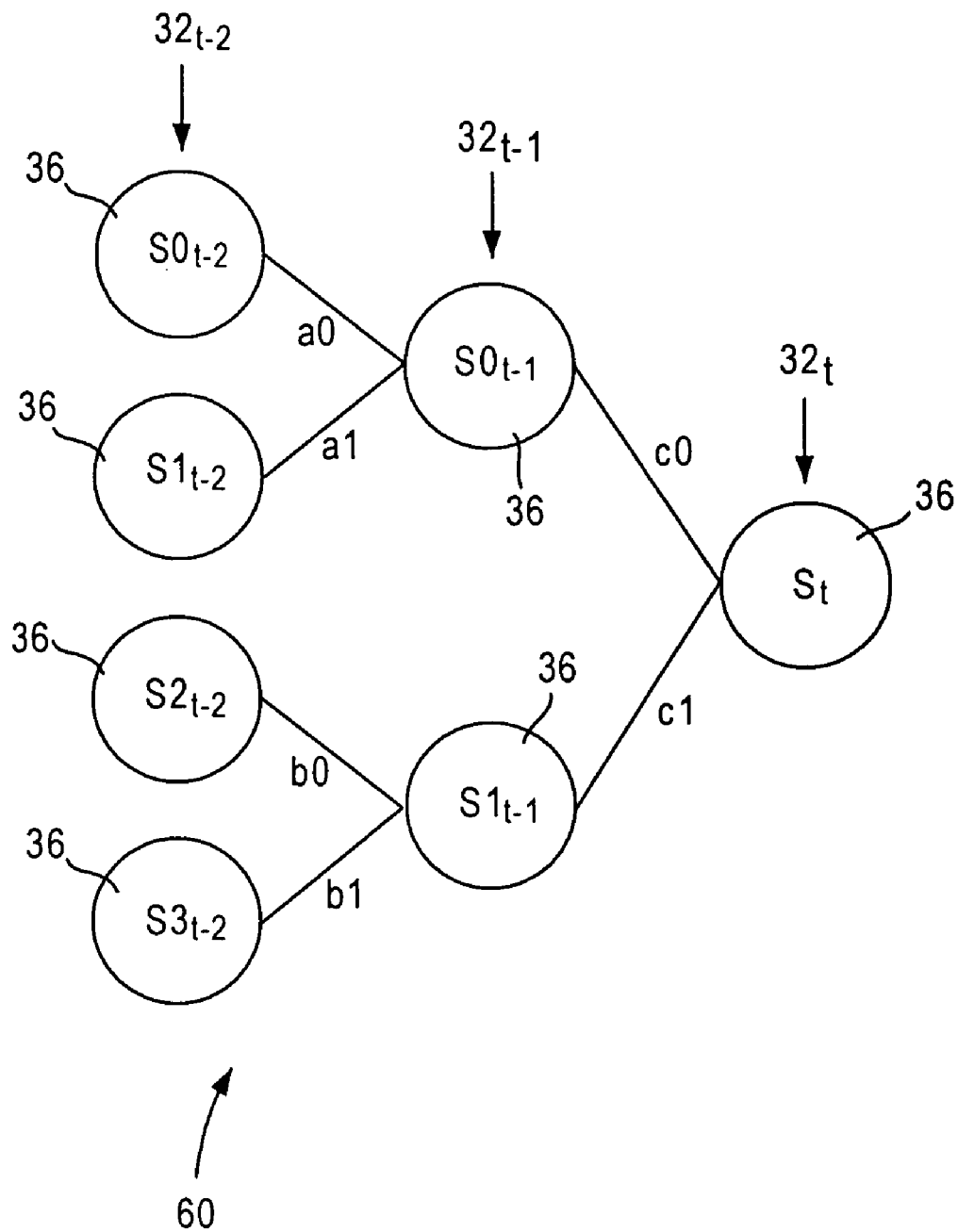
FIG. 4 is a diagram illustrating a radix-4 state transition structure used by the Viterbi decoder of FIG. 1 for generation of survivor metrics for respective encoder states.

FIG. 4 is a diagram illustrating a radix-4 structure 60 used for tracking state history and generating accumulated survivor metric values, according to an embodiment of the present invention. The state history table 26 captures the encoder trellis structure in the form of a radix-4 structure to enable backtrace through the path of most likely encoder sequences given a code word and accumulated survivor metrics. FIG. 4 illustrates the radix-4 structure 60 used for a given encoder state 36 (e.g., 0-63). In particular, the encoder state $S_t$ at time instance $32_t$ is reached based on the illustrated states 36 at time instance $32_{t-2}$ reaching the illustrated states at time instance $32_{t-1}$ with respective trellis branch metrics a0, a1, b0, and b1; the illustrated states at time instance $32_{t-1}$ reach the encoder state $S_t$ at time instance $32_t$ with respective trellis branch metrics c0 and c1.

For comparison, a conventional trellis diagram only consists of three states per iteration (current and two previous possible states). Hence, the radix-4 structure 60, at the cost of doubling the amount of add-compare-select hardware required for computation (described below with respect to FIG. 5), enables theoretical data rate at the decoder output of 80 Mb/s.

The state history table 26 of FIG. 6A is populated (i.e., stored) the prior encoder state entries 30 with the identifier values 34 that identify the decoded (2-bit) decoded values, based on identifying the optimum survivor metric, described below with respect to FIG. 5.

Hence, rather than enumerate previous state information related to encoder trellis in decimal representation (i.e., 0-63), each possible encoder state in the trellis uses a 2-bit tag 34 to enumerate the 4 possible previous branches (encoder states) for a given node. This information is retained for at least 50 steps in the backtrace algorithm (the chosen decoder depth). Since these tag identifiers correspond to actual bits encoded during state transitions, concatenation of a set of identifiers during backtracing is equivalent to decoding the transmitted code word.

Since 64 encoder states are possible, and 64 is a convenient choice for row addresses in a RAM element, the state history table 26 is implemented as a two-port (RD/WR) 64×128 bit SRAM.

Figure 5:
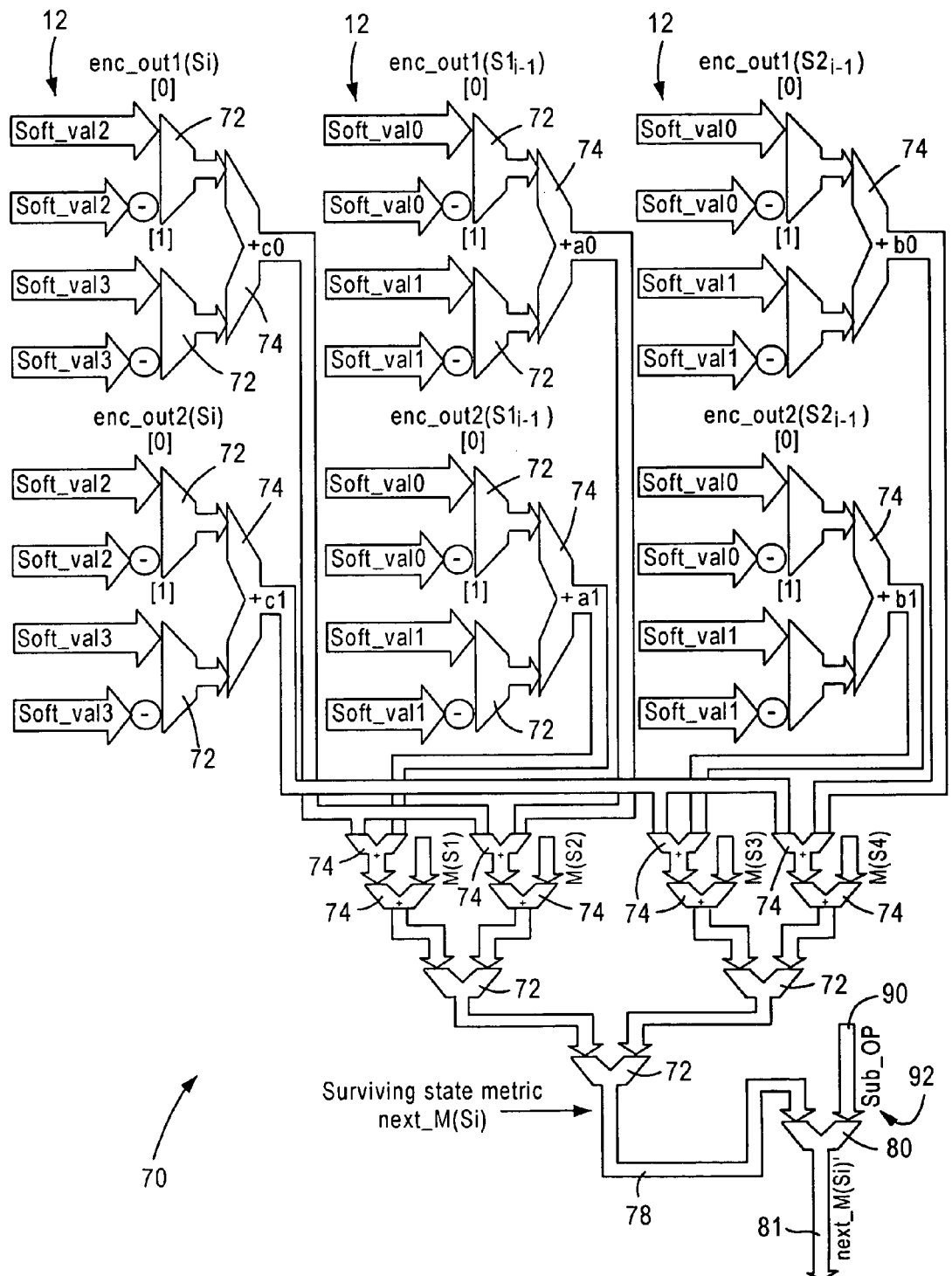
FIG. 5 is a diagram illustrating in detail the maximum surviving state metric calculation module of FIG. 1.

FIG. 5 is a diagram illustrating the MS calculation module 70 having comparators 72 and adders 74 for identifying, for a corresponding encoder state 36 at a given time instance 32, a maximum surviving state metric value $M(S_i)$ for a corresponding state $S_t$ at the corresponding time instance $32_t$. The add-compare-select logic 22 includes a module 70 for each encoder state 36, where each module 70 is configured for calculating the state metric value $M(S_i)$ for the corresponding encoder state 36. Each module 70 for a corresponding encoder state 36 is configured for identifying the maximum surviving state metric value (next_$M(S_i)$), with respect to the radix-4 structure of FIG. 4, among the following metric value-equations:

$$M0 = a0 + c0 + M(S2)$$

$$M1 = a1 + c0 + M(S1)$$

$$M2 = b0 + c1 + M(S4)$$

$$M3 = b1 + c1 + M(S3)$$

Where M(S1), M(S2), M(S3) and M(S4) are the accumulated surviving state metric values for states $S1_{t-2}$, $S0_{t-2}$, $S3_{t-2}$, and $S2_{t-2}$, of FIG. 4, respectively, and a0, a1, b0, b1, c0, and c1, are the branch metrics, respectively. Hence, the module 70 determines the maximum surviving state metric value (next_$M(S_i)$) from the maximum of the values M0, M1, M2, and M3, and outputs the maximum value at signal path 78.

Although state history information is retained for only 50 iterations in the traceback algorithm, cumulative survivor metrics for each of the 64 possible surviving paths must be retained for the entire data decoding process. If the maximum code word size is 4095 bytes, this sum can be substantial ($>2^{20}$).

Since the cumulative metrics are only useful as a relative measure of surviving path likelihood, the most efficient method for storing the survivor metrics is to compress the relative values to maintain the dynamic range. In particular, the survivor metrics can reach a substantially large value (>20 bits) over the course of multiple iterations. Hence, it is desirable to retain the optimum values and reduce the redundant information to reduce memory requirements.

According to the disclosed embodiment, each module 70 includes a subtractor circuit 80 configured for subtracting the surviving state metric (next_M(Si)) output via signal path 78, prior to storage in the survivor metric register file via signal path 81, by a prescribed subtraction operator (Sub_Op) 92 output by the subtraction operator module 71 in response to a prescribed event. Hence, the add-compare-select circuit 22 includes 64 subtractor circuits 80 for the respective 64 possible encoder states for outputting the compressed surviving state metrics (next_M(Si)') via signal path 81. Note that the subtractor circuits 80 could be combined into a single subtractor circuit shared by the modules 70 to reduce area requirements upon reduction to silicon.

Figure 8:
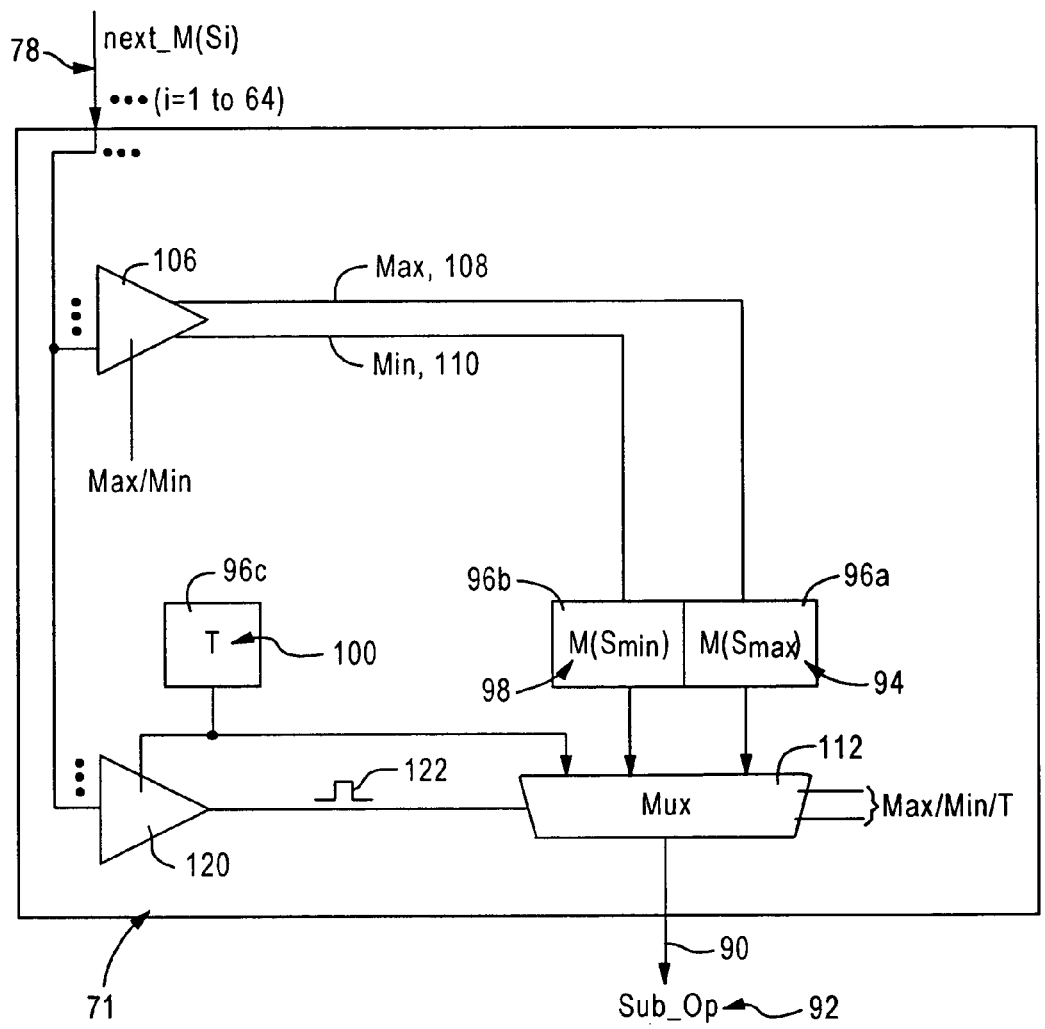
FIG. 8 is a diagram illustrating the subtraction operator module of FIG. 1, according to an embodiment of the present invention.

FIG. 8 is a diagram illustrating the subtraction operator module 71 of FIG. 1. The subtraction operator module 71 illustrates three available implementations for a subtraction operator 92, although it will be apparent that typically only one operator 92 will be selected when the circuit is implemented in silicon. The three available implementations of the subtraction operator 92 include a maximum previous survivor path metric (M(Smax)) 94 stored in a register 96a, a minimum positive previous survivor path metric (M(Smin)) 98 stored in a register 96b, and a prescribed threshold (T) 100 stored in a register 96c.

Figure 9A:
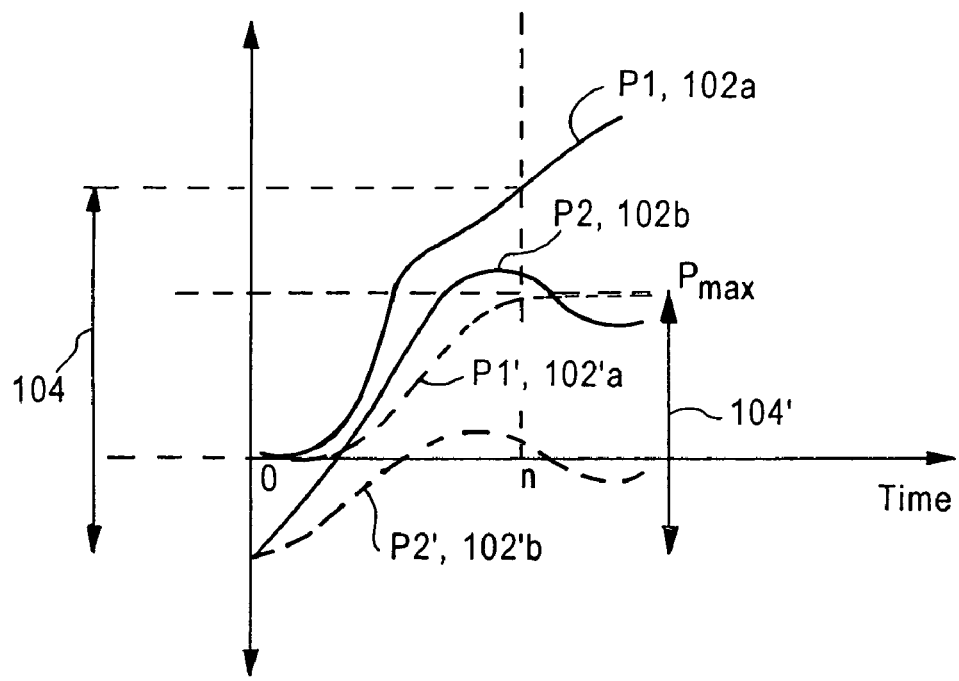
FIGS. 9A, 9B, and 9C are diagrams illustrating the compression in dynamic range of the survivor metrics based on maximum, minimum, and threshold-based subtraction operations, respectively, by the subtraction operator module of FIG. 8.

FIG. 9A is a diagram illustrating the effect of using the maximum previous survivor path metric (M(Smax)) 94 as the subtraction operator 92. As illustrated in FIG. 9A, the survivor path metrics (P1) 102a and (P2) 102b can increase monotonically without implementation of a subtraction operator 92, resulting in a substantially large dynamic range 104 that increases over time. However, use of the maximum previous survivor path metric 94 results in the compressed survivor path metrics (P1') 102'a and (P2') 102'b within the identifiable range 104' of twice the maximum branch metric.

As illustrated in FIG. 8, the subtraction operator module 71 can be implemented to output the maximum previous survivor path metric (M(Smax)) 94 based on using a comparator 106 configured for identifying a maximum 108 from the immediate prior instance. The maximum 108 is stored in the register 96a as the maximum previous survivor path metric 94 for subtracting each survivor metric in the next instance as the subtraction operator 92. (The multiplexer 112 is used merely to illustrate the different available implementations of the subtraction operator 92, described below).

Hence, the subtraction operator 92 supplied to the subtractor 80 via the signal path 90 is applied to all the sixty-four (64) survivor path metrics (next_M(Si)) output via path 78 for each of the encoder states.

Hence, the subtractor circuit 80 subtracts the maximum previous cumulative path metric from all path metrics calculated in the current cycle. In doing so, the required survivor metric register width is reduced from >20 bits to only 9 (+/-128 plus an extra bit for margin), at a nominal cost in ACS circuit area and timing.

Figure 9B:
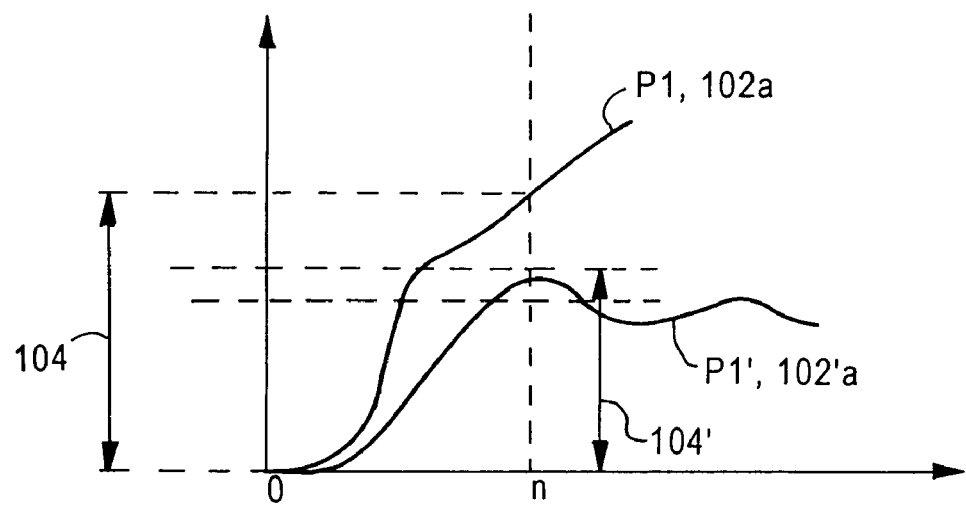

FIG. 9B is a diagram illustrating the effect of using the minimum positive previous survivor path metric (M(Smin)) 98 as the subtraction operator 92. As illustrated in FIG. 9B, the survivor path metric (P1) 102a can increase monotonically without implementation of a subtraction operator 92; however, use of the minimum positive previous survivor path metric 98 results in the compressed survivor path metric (P1') 102'a within an identifiable range 104'.

As illustrated in FIG. 8, the subtraction operator module 71 can be implemented to output the minimum positive previous survivor path metric (M(Smin)) 98 based on configuring the comparator 106 to identify a minimum 110 from the immediate prior instance. The minimum 110 is stored in the register 96b as the minimum positive previous survivor path metric 98 for subtracting each survivor metric in the next instance as the subtraction operator 92.

Note that use of the maximum previous cumulative path metric 94 or the minimum previous cumulative path metric 98 may initially cause negative results, hence the logic should be configured to accommodate negative numbers.

Figure 9C:
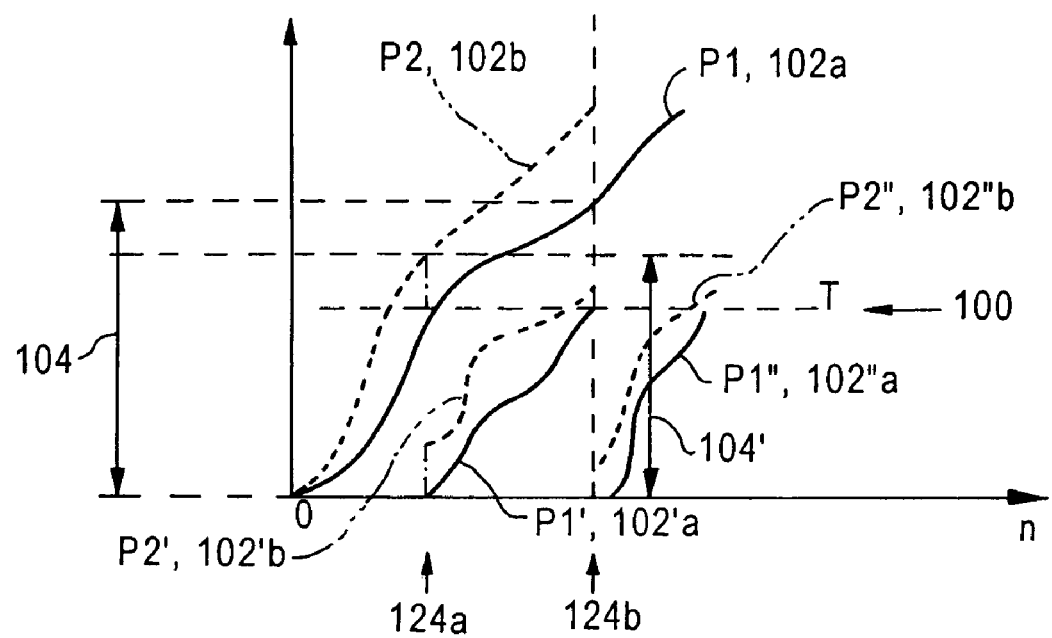

FIG. 9C is a diagram illustrating the effect of using the threshold (T) 100 as the subtraction operator 92. As illustrated in FIG. 8, the subtraction operator module 71 can be implemented to output the threshold (T) 100 as the subtraction operator 92 in response to a comparator 120 detecting that any one of the sixty-four (64) survivor path metrics (next_M(Si)) on the signal path 78 exceed the threshold (T). In response to any one of the survivor path metrics exceeding the threshold (T) 100, the comparator outputs a strobe signal 122 that causes the threshold (T) to be output as the subtraction operand 92 for subtracting only the survivor path metrics at that instance (e.g., 124a, 124b, shown in FIG. 9C).

As illustrated in FIG. 9C, the survivor path metrics (P1) 102a and (P2) 102b can increase monotonically without implementation of a subtraction operator 92; however, use of the threshold (T) at instance 124a results in the compressed survivor path metrics (P1') 102'a and (P2') 102'b within the identifiable range 104'. In addition, use of the threshold (T) at instance 124b results in the compressed survivor path metrics (P1") 102"a and (P2") 102"b.

Hence, implementation of any one of the maximum value 94, minimum value 98, or the threshold 100 as a subtraction operator 92 substantially reduces the range of the survivor path metrics, enabling the size of the survivor metric register file 24 to be substantially reduced.

Figure 7:
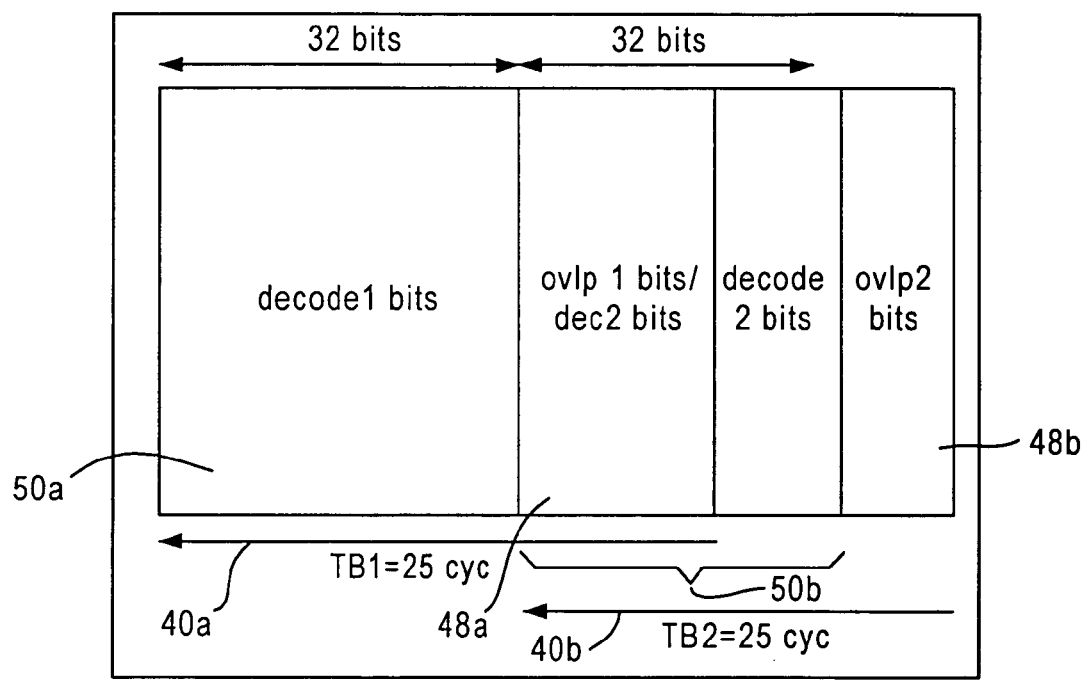
FIG. 7 is a diagram illustrating concurrent traceback operations by the Viterbi decoder of FIG. 1 using window overlapping, according to an embodiment of the present invention.

FIG. 7 is a diagram illustrating concurrent traceback operations using respective decoding windows 40a and 40b, according to an embodiment of the present invention. In particular, the second state history table RAM 26' and duplicate data decoding logic is added to the decoder data path in order to meet the 54 Mbps data rate requirement (32/50=51.2 Mbps). In particular, the consecutive traceback operations 40a and 40b use overlapped encoder state entries 48a, enabling the traceback operations 40a and 40b to generate the decoded bits 50a and 50b, respectively. As illustrated in FIG. 7, the traceback operation 40b also will utilize overlapped bits 48b which will also will be accessed by the next successive backtracing operation.

According to the disclosed embodiment, a windowed traceback Viterbi decoding can be implemented in an ASIC in an efficient manner, enabling a data throughput of 54 Mbps while requiring only two 4 Kilobyte SRAMs for the state history tables 26 and 26'. Multiple decoded bits can be output from a single traceback operation, without concern of an appreciable performance loss.

While this invention has been described with what is presently considered to be the most practical preferred embodiment, it is to be understood that the invention is not limited to the disclosed embodiments, but, on the contrary, is intended to cover various modifications and equivalent arrangements included within the spirit and scope of the appended claims.

What is claimed is:

1. A method in a Viterbi decoder for decoding received encoded bit pairs, the method comprising:

first storing in a survivor metric register file, for each received bit pair at a corresponding time instance, a survivor metric that specifies a corresponding probability of the received bit pair and a previous surviving bit sequence having been generated by a convolutional encoder according to a corresponding possible encoder state, the first storing step including selectively subtracting from each survivor metric, prior to storage thereof, by a prescribed subtraction operator based on a prescribed event, and storing the subtracted survivor metric as the stored survivor metric;

second storing in a state history table memory, for each of the received bit pairs at the corresponding time instance, a prior encoder state entry configured for identifying a surviving predecessor state relative to a corresponding encoder state; and outputting at least one decoded bit pair based on execution of a backtracing operation that includes accessing a prescribed number of the prior encoder state entries for the respective prescribed number of time instances, the accessing including identifying one of the encoder states, stored at a corresponding first time instance, as an initial backtracing state based on having the corresponding survivor metric specifying a highest probability relative to the other survivor metrics at the corresponding first time instance.

2. The method of claim 1, wherein the selectively subtracting step includes:

retrieving, as the prescribed subtraction operator, a maximum previous survivor path metric having been calculated during an immediate prior instance; and subtracting from each survivor metric by the maximum previous path metric for each corresponding time instance as the prescribed event.

3. The method of claim 1, wherein the selectively subtracting step includes:
retrieving, as the prescribed subtraction operator, a minimum positive previous survivor path metric having been calculated during an immediate prior instance; and
subtracting from each survivor metric by the minimum previous path metric for each corresponding time instance as the prescribed event.

4. The method of claim 1, wherein the selectively subtracting step includes:
retrieving a prescribed threshold representing the prescribed subtraction operator;
detecting whether the prescribed event has occurred during the corresponding time instance based on determining whether any of the survivor metrics have exceeded the prescribed threshold during the corresponding time instance; and
subtracting from each of the survivor metrics by the prescribed threshold based on determining at least one of the survivor metrics having exceeded the prescribed threshold.

5. A Viterbi decoder including:
an add-compare-select logic circuit configured for generating, for each received bit pair at a corresponding time instance, a survivor metric that specifies a corresponding probability of the received bit pair and a previous surviving bit sequence having been generated by a convolutional encoder according to a corresponding possible encoder state, the add-compare-select logic configured for selectively subtracting from each survivor metric, prior to storage thereof, by a prescribed subtraction operator based on a prescribed event;
a survivor metric register file configured for storing the respective subtracted survivor metrics for the respective possible encoder states;
a state history table memory configured for storing, for each of the received bit pairs at the corresponding time instance, a prior encoder state entry configured for identifying a surviving predecessor state relative to a corresponding encoder state; and
a state machine configured for outputting at least one decoded bit pair based on execution of a first backtracing operation that accesses a prescribed number of the prior encoder state entries for the respective prescribed number of time instances, the first backtracing operation configured for identifying one of the encoder states, stored at a corresponding first time instance, as an initial backtracing state based on having the corresponding survivor metric specifying a highest probability relative to the other survivor metrics at the corresponding first time instance.

6. The decoder of claim 5, wherein the add-compare-select logic circuit includes:
subtraction operator module configured for outputting the prescribed subtraction operator at the prescribed event; and
subtractor means configured for subtracting from each survivor metric by the maximum previous path metric for each corresponding time instance as the prescribed event.

7. The decoder of claim 6, wherein the subtraction operator module includes a register configured for storing a maximum previous survivor metric having been calculated by the add-compare-select logic circuit during an immediate prior instance, the subtraction operator module outputting the maximum previous survivor metric to the subtractor means during the corresponding time instance.

8. The decoder of claim 7, wherein the subtraction operator module includes a register configured for storing a minimum positive previous survivor metric having been calculated by the add-compare-select logic circuit during an immediate prior instance, the subtraction operator module outputting the maximum previous survivor metric to the subtractor means during the corresponding time instance.

9. The decoder of claim 7, wherein the subtraction operator module includes:
a register configured for storing a prescribed threshold representing the prescribed subtraction operator; and
comparator means configured for detecting whether the prescribed event has occurred during the corresponding time instance based on determining whether any of the survivor metrics have exceeded the prescribed threshold during the corresponding time instance;
the subtraction operator module configured for outputting the prescribed threshold to the subtractor means, for subtraction from each of the survivor metrics by the prescribed threshold, based on determining at least one of the survivor metrics having exceeded the prescribed threshold.

* * * * *